United States Patent [19]

Kulicke, Jr. et al.

[11] 4,073,424
[45] Feb. 14, 1978

[54] SECOND BOND POSITIONING WIRE BONDER

[75] Inventors: Frederick W. Kulicke, Jr., Philadelphia; Albert Soffa, Wynnewood, both of Pa.; Dan Vilenski; Asher Brockmann, both of Haifa, Israel

[73] Assignee: Kulicke and Soffa Industries Inc., Horsham, Pa.

[21] Appl. No.: 715,042

[22] Filed: Aug. 17, 1976

[51] Int. Cl.² .............................................. H01L 21/60
[52] U.S. Cl. ................................ 228/4.5; 74/471 XY; 228/7; 228/102
[58] Field of Search .................. 228/4.5 BA, 7, 102; 74/471 XY; 269/296

[56] References Cited
U.S. PATENT DOCUMENTS

| | | | |
|---|---|---|---|
| 3,149,510 | 9/1964 | Kulicke, Jr. | 228/4.5 |
| 3,175,820 | 3/1965 | Schiler | 269/296 |
| 3,773,240 | 11/1973 | Heim | 228/4.5 |

*Primary Examiner*—Donald G. Kelly
*Assistant Examiner*—K. J. Ramsey

[57] ABSTRACT

An apparatus for automatically positioning a wire bonding machine at a second bond position is provided with a plurality of individually adjustable second bond positioning devices set at second bond positions and cooperable with second bond positioning actuating means. After positioning a semiconductor at a first bond position and completing a first bond, the second bond actuating means cooperating with a second bond positioning device automatically moves the semiconductor to a second bond position. After completing the second bond, the second bond positioning actuating means is released permitting the semiconductor to return to a first bond position as another second bond positioning device is cycled into active position.

20 Claims, 13 Drawing Figures

SECOND BOND POSITIONING WIRE BONDER

BACKGROUND OF THE INVENTION

1. Field of the Invention

The present invention relates to automatic and/or semi-automatic wire bonder and more particularly to a wire bonder having means for automatically positioning a semi-conductor relative to the bonding tool of the wire bonder at a second bond position.

2. Description of the Prior Art

Automatic wire bonders have been made which operate similar to numerical controlled machine tools. A semiconductor device to be wire bonded is placed in working position on the wire bonding machine and a plurality of wires, each having first and second bond positions, are attached to the semiconductor device and/or the supporting substrate. A program is generated by servo devices as the first semiconductor is manually wire bonded. The program of the first bonding pattern is recorded and may then be employed to duplicate the same routine of wire bonds on other semiconductors. The process of generating the program is referred to as the learning mode or the teaching mode, implying that subsequent devices are bonded with the program in a working mode. It is well known in the electronic data processing field that such programs may be stored in several types of memories which include solid state electronic memories of the type employed with programable electronic computing machines.

Automatic wire bonders employing solid state memories and solid state computing devices are expensive to build and are expensive to service or maintain. Automatic electronic programable wire bonders can be programmed to make both first and second wire bonds on a plurality of different devices. Since automatic electronic programable wire bonders produce a large number of bonds in a very short period of time, it is important to monitor the bonding operation to be sure that the operation is being performed correctly.

It has been the practice in the past to provide an operator on each automatic electronic wire bonder who observes the individual bonds to determine if malfunctions occur.

Semi-automatic wire bonders which perform a first bond and then automatically move the bonding tool rearward and upward to a position over a second bond position are known. U.S. Pat. No. 3,543,988 describes such a second bond positioning device, however, since the distances from the first bond positions to the second bond positions vary, the second bond position is not programmed for automatic bonding. Bonders of this type were not provided with means for individually programming each of the second bond positions but instead position the bonding tool at or near the second bond position enabling the operator to make a faster final position manually before activating the second bond.

It has been suggested that a wire bonder embodying cams similar to those described in U.S. Pat. No. 3,543,988 could be employed to position an X-Y table supporting a work holder so that a semiconductor device thereon could be moved from a first bond position automatically. In theory the suggestion is feasible, however, the need for precision machining required to produce such cams presents a first problem. In practice the manner in which individual active chips are connected to a substrate presents a more formidable problem. The active semiconductor device usually has bonding pads at the outer perimeter representative of the first bond positions. the active semiconductor device is die bonded or attached to a substrate having a plurality of bonding pads surrounding the active chip which are representative of the second bond position. It has not been commercially practical to place an active chip in the exact center of orientation of the substrate so that the distances between the first and second bonds remain constant, nor has it been commercially feasible to provide the exact orientation between the active chip and different substrates. Accordingly, a set of cams for positioning an X-Y table are not useful for automatic wire bonders. When wire bonders are provided with X-Y positioning cams they may be employed to locate the second bond position after making a first bond position in a manner similar to that described in U.S. Pat. No. 3,543,988. If the cams are made extremely accurate and the second bond position pads are made larger, the second bond may be programmed to be made automatically after the first wire bond position is made manually and the first bond made. Such devices do not provide self-teaching of a first or a second bond position.

In the prior art employing automatic wire bonders, self-teaching may be accomplished by actually making wire bonds at the first and/or the second bond positions. A preferred manner of self-teaching a bond position is to employ a very fine beam of light from an aiming device which is adjusted to provide a spot of light from the spotlight at the exact point where the bonding tool will attach the wire to the bonding pads. The bond positions can be entered into a program automatically for use in an automatic electronic wire bonder. An aiming device of the type used to locate bond positions without engaging the bonding tool is described in U.S. Pat. No. 3,661,316.

Heretofore, automatic electronic wire bonders have been provided with means for self-teaching the first and the second bond position. Such self-teaching means comprise expensive servos which generate program data capable of being repeated.

Heretofore, mechanical wire bonders having cams for establishing an exact or approximate second bond position were not provided with any device for self-teaching the second bond positions.

It would be extremely useful to provide an inexpensive, reliable, fast acting electro mechanical wire bonder which would automatically perform second wire bonds after a first wire bond has been made manually and which could be self-taught or programmed to achieve the second bond in the manner now achieved by expensive automatic electronic wire bonders.

SUMMARY OF THE INVENTION

It is a primary object of the present invention to provide a wire bonder capable of automatically performing second wire bonds.

It is another object of the present invention to provide an apparatus for automatically performing second bonds which is adapted to be used as a conversion assembly unit in prior art electro mechanical wire bonder machines.

It is another object of the present invention to provide a novel mechanically settable programmable device for automatically positioning semiconductor device at second wire bond positions.

It is a general object of the present invention to provide a novel mechanically programmable positioning device for a wire bonding machine which is removable as an assembly and storable as a program.

It is another general object of the present invention to provide an easily removable mechanically programmable second bond positioning means which can be replaced with another programmable second bond positioning means having a different number of second bond positions thereon.

It is another general object of the present invention to provide a semi-automatic wire bonder which only requires an operator to concentrate on and to locate first bond positions.

It is another object of the present invention to provide a novel manipulator for positioning a movable platform to a first bond position which may be demobilized when said movable platform is moved to a second bond position.

In accordance with these and other objects of the invention to be described hereinafter there is provided a wire bonding machine having an apparatus for automatically making a second wire bond after a first wire bond is manually initiated. The apparatus comprises a rotary positioning table having a plurality of recessed cups thereon which are individually movable and are settable in positions which are indicative of second bond positions. After the semiconductor to be bonded is moved to a first bond position by an operator manipulating the movable platform which supports the semiconductor device, the first bond is initiated and a convex actuator connected to the movable platform is moved into engagement with one of the recessed cups. Th camming action of the actuator engaging the recessed cup moves the movable platform and the semiconductor device to a second bond position where the second bond position is made automatically. Release of the convex actuator permits the movable platform and the semiconductor device to return to the first bond position as a new recessed cup on the rotatable table is moved into position opposite the convex actuator.

DESCRIPTION OF THE PREFERRED EMBODIMENT

Figure 1:
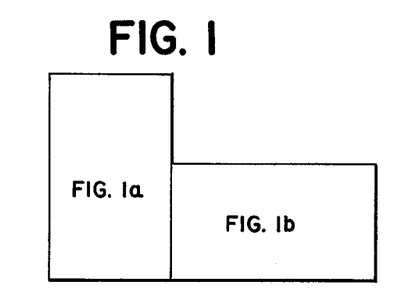
FIG. 1 including 1a and 1b is an elevation in partial section taken through a preferred embodiment positioning mechanism of a wire bonding machine.
Figure 1A:
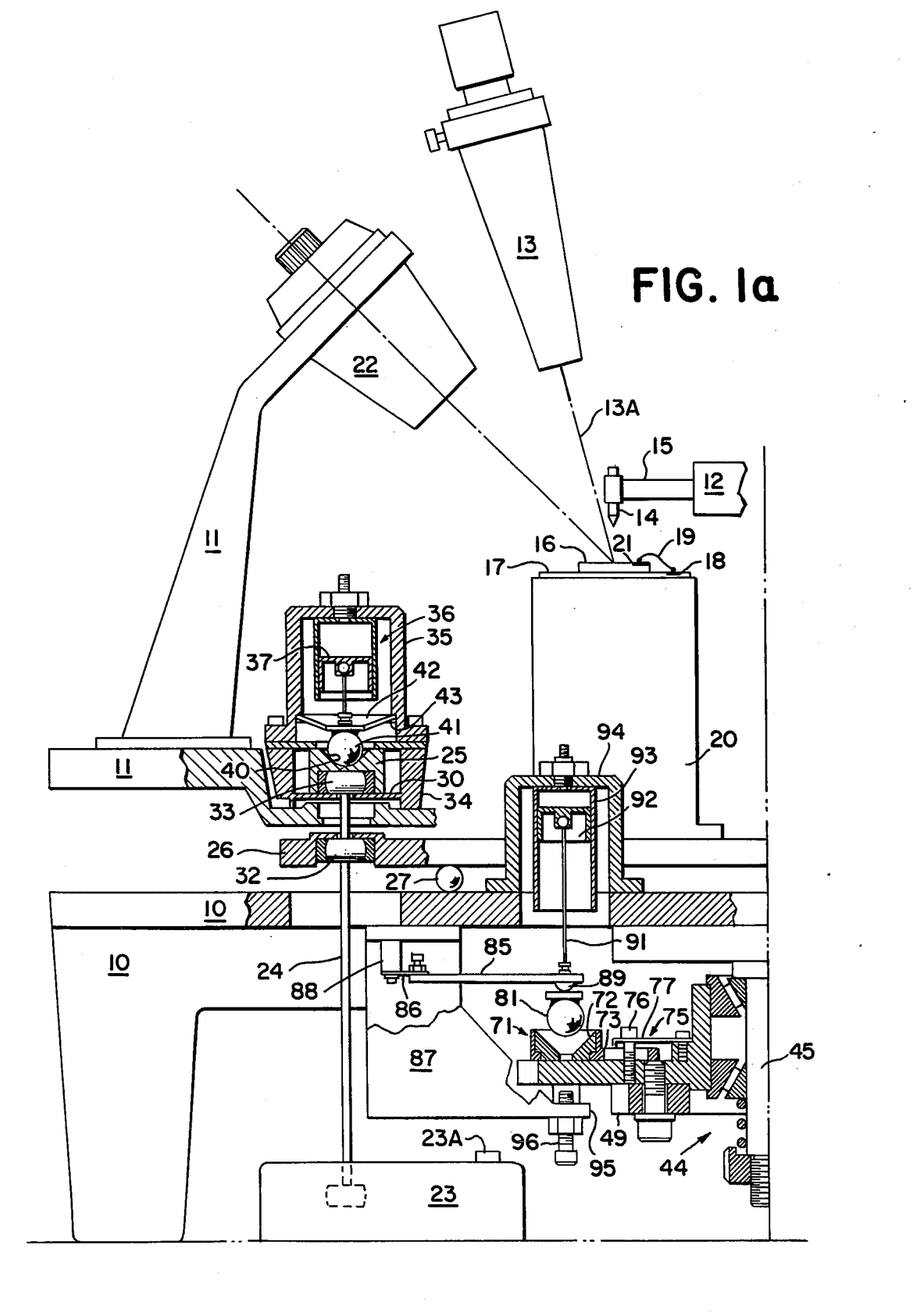
Figure 1B:
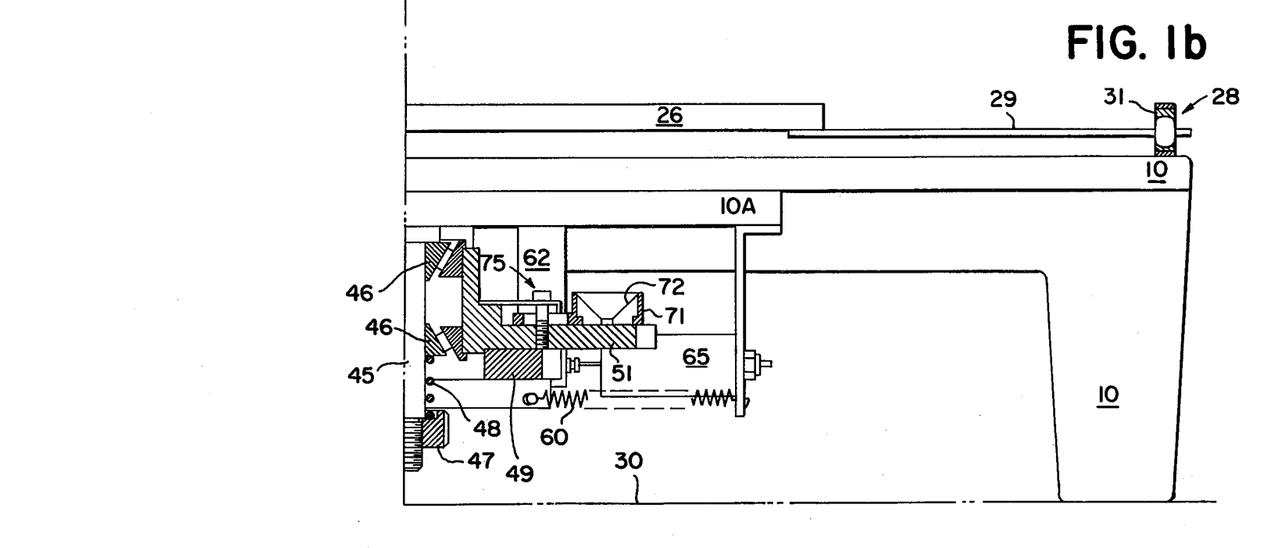

Refer now to FIG. 1 showing a schematic elevation view in partial section of a preferred embodiment of the present invention. The rigid base 10 for supporting the novel positioning apparatus is of the type employed in the Model 478 family of Wire Bonders made by Kulicke & Soffa Industries Inc. located in Horsham, Pennsylvania. The rigid base 10 is provided with a bracket 11 for supporting a microscope. The base 10 further provides support for a bonding tool holder 12 and a spotlight 13 which shines a small spot of light on the exact point where the bonding tool 14 will touch the electrode bonding pad and attach a wire. The type of bonding tool 14 and transducer 15 employed to make wire bonds in this invention is not shown in detail, however, the present invention may be employed with ultrasonic wire and/or thermocompression wire bonders which are well known in the wire bonding art.

For purposes of explaining the present invention a semiconductor device 16 of the integrated circuit type is shown attached to a substrate 17 which has a circuit formed thereon. The substrate circuit includes a plurality of second bond position bonding pads 18 which are to be attached to wires 19 to first bond position bonding pads 21 on the semiconductor device 16.

It is possible to make first and second wire bonds on different parts of the substrate circuit, however, for purposes of this explanation the first wire bond is made at the first bonding position where the wire 19 starts and the second bond is made at the second bond position where the wire 19 terminates.

An observer seated in microscope 22 is able to move micromanipulator hand chessman control 23 in a horizontal X-Y plane. The X-Y movement of chessman control 23 is reduced in proportion to the ratio of the full length of lever 24 to the length of lever 24 between the movable pivot mount 25 and movable platform 26. Movable platform 26 is supported on two ball type bearings 27 and a single turning and sliding pair 28. The turning and sliding pair 28 provides a kinematic restraint for movement of movable platform 26 so that the movement of the platform is substantially orthagonal. The kinematic restraining means 28 comprises a rod 29 slidably fitted into a Heim bearing 31 which is mounted on a fixed frame 10. Other sliding and turning pairs are well known, and need not be described herein.

When the upper movable pivot mount 25 is demobilized and effectively fixed to rigid frame 10, movement of the chessman control 23 will pivot chessman rod 24 which is slidably mounted through front Heim bearing 32 mounted in platform 26. Since Heim bearing 31 is remotely located from bearing 32, X and Y movement of chessman control 23 effects substantially the same X and Y movement of platform 26 on a reduced scale.

The upper end of chessman rod 24 is mounted in upper Heim bearing 33 supported in pivot mount 25. Pivot mount 25 is slidably mounted on surface 30 of fixed lower housing 34 and when not restrained moves freely thereon. Fixed upper housing 35 supports actuator 36 therein. A preferred constant friction actuator 36 has an air piston 37 mounted in an air cylinder 38 for air actuation. Other forms of actuators may be employed such as electrical solenoids, however, air cylinders have found to be both inexpensive and extremely reliable. Actuation of piston 37 downwardly causes connecting rod 39 to force actuating ball 41 into the conical recess 40 in pivot mount 25. Actuating ball 41 is welded to pivoting lever 42 which is pivotally mounted by a leaf spring 43 on housing 35 to prevent lateral movement of the actuating ball 41. It will be understood that the position of mount 25 is accurately determined by actuating ball 41. It may be desirable to maintain a very slight yieldable pressure on actuating ball 41 when movable platform 26 is being moved from a first bond position to a second bond position in order to maintain a slight amount of damping and friction in the system.

When actuating ball 41 tightly engages in the recess 40, as shown in FIG. 1, the operator locates the light beam from light pencil 13 on the first bond pad 21 and depresses the bond sequence control button 23A to cause a sequence of operations including making a first bond and automatically moving the movable platform 26 to a bonding pad 18 opposite 15 to enable a second bond to be made thereon. The means for positioning platform 26 to a second bond position includes removable rotary frame 44. Movable frame 44 is mounted on a vertical shaft 45 fixed on frame 10 to permit rotary movement through thrust bearings 46. Retainer means comprising a retaining nut 47 and retaining spring 48 force the lower thrust race on shaft 45 into engagement with the lower thrust bearings 46. The movable frame 44 comprises a ratchet disk 49 and a rotary table 51 for supporting a plurality of individually adjustable positioning devices thereon.

Figure 2:
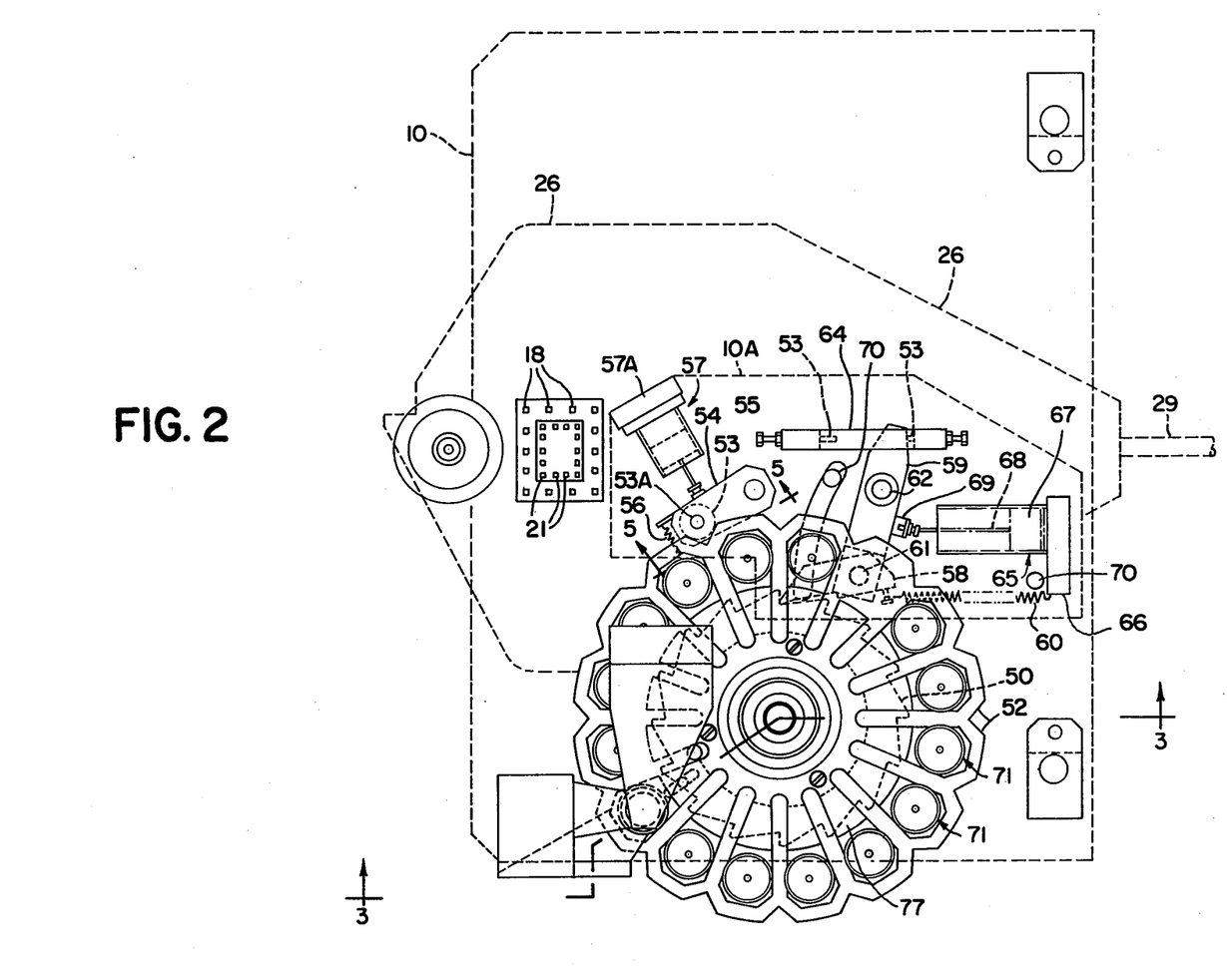
FIG. 2 is a plan in partial section of the second bond positioning mechanism of FIG. 1.
Figure 5:
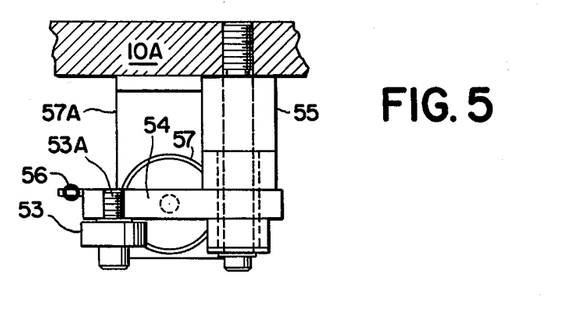
FIG. 5 is an enlarged detail in elevation taken at lines 5—5 of FIG. 2.

Refer now to FIGS. 1 and 2 showing the second bond positioning means comprising movable frame 44. Rotary table 51 is provided with vee grooves 52 or detents into which detent roller 53 engages. Detent roller 53 is rotatably mounted on a stub shaft 53A on detent arm 54 which is pivotally mounted on a pivot shaft 55 fixed in adapter plate 10A. A spring 56 may be provided to aid in returning roller 53 into detent 52, however, in the preferred embodiment shown, air actuator 57 comprising a piston in an air cylinder may be cycled to provide a light force or no force when rotary table 51 is being rotated and a high force after rotary table 51 is moved into a new second bond position. FIG. 5 shows in elevation the detent roller 53 on detent arm 54 and the actuator 57 mounted on angle bracket 57A which is affixed to adapter plate 10A.

Rotary table 51 is rotated by a ratchet pawl 58 through a predetermined angular movement. Ratchet pawl 58 is pivotally mounted on pivot arm 59 via pivot pin 61. Pivot arm 59 is pivotally mounted on a stub pivot shaft 62 fixed in adapter plate 10A which is attached to rigid frame 10. The amount of angular movement imparted to rotary table 51 by ratchet pawl 58 may be determined by the size of the ratchet steps 50 and the stroke of ratchet pawl 58 which is limited by adjustable stops 53 on stop bracket 64 fixed on adapter plate 10A. Pivot arm 59 is moved by ratchet actuator 65 mounted on an angle bracket 66 on adapter plate 10A. The piston 67 of actuator 65 is provided with a piston rod 68 swiveled at both the piston 67 end and the pivot arm 59 end. The rod end assembly 69 attached to arm 59 is of the type employed with the preferred air actuators shown and described herein before and comprises a ball on rod 68 which is captured in a spherical recess of assembly 69, thus, enabling the piston 67 to exert force on rod 68 in two directions. A return spring 60 may be provided to return ratchet pawl 58 to its normal rest position after indexing rotary table 51 one index position. The position of the spring 60 also enables the biasing of pawl 58 into engagement with ratchet step 50. Actuator 65 may also be cycled to return pivot arm 59 to its normal rest position.

Adapter plate 10A is mounted on fixed frame 10 through a pair of locking screws 70, one of which is mounted through an arcuate slot 70A. Adapter plate 10A may be pivoted outwardly when a larger ratchet disk 49 is needed to provide additional ratchet steps 50. It will be understood that the ratchet disk 49 and rotary table 51 may be enlarged to accomodate the largest number of pads on semiconductor devices. In the event the number of second bond positions are fewer than the number of ratchet steps on ratchet disk 49, the operator may activate a return-to-zero or start switch (not shown) or a counter may be provided which will return to start after the last second bond is completed.

Figure 3:
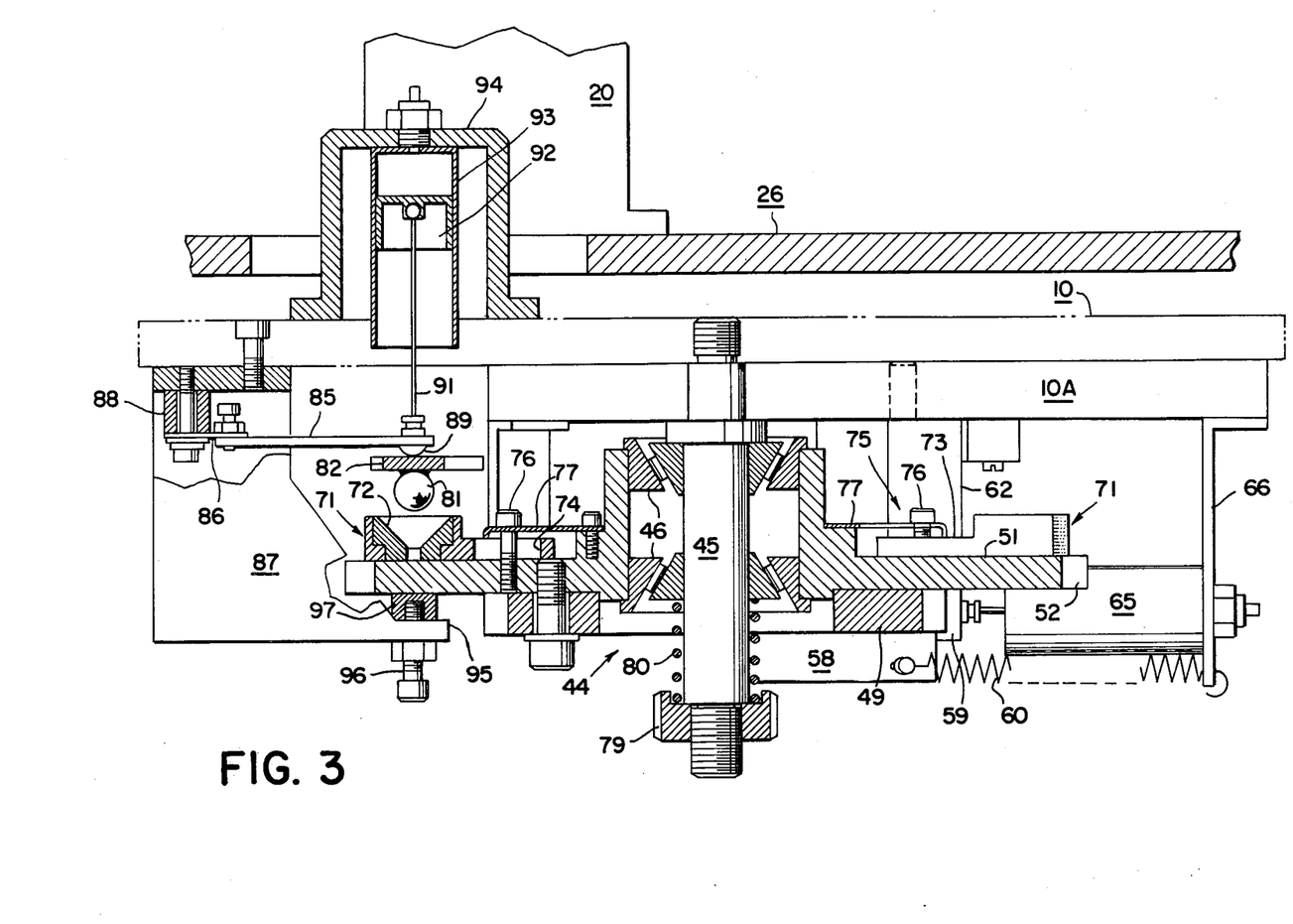
FIG. 3 is an enlarged detail in elevation taken at lines 3—3 of FIG. 2.

Refer now to FIGS. 1 to 3 showing the novel second bond positioning means and the second bond position. A plurality of individually adjustable positioning devices 71 are supported on movable frame 44. Each device 71 comprises a removable teflon conical recess 72 and a foot portion 73 having a slot 74 therein. Each clamping means 75 comprises a clamp screw 76 which engages through slot 74 and is adapted to engage resilient toe clamp 77 with the top of foot 73. In the preferred embodiment shown, toe clamps 77 are provided on a single resilient finger plate mounted on a shoulder of the hub portion of movable frame 44. Other types of individual clamping means 75 may be provided to hold devices 71 in a desired present second bond position.

When setting the second bond positions, a teaching mode of operation is employed. A semiconductor device 16 mounted on a substrate 17 is accurately positioned and mounted on base 20. Clamp screws 76 are loosened to permit positioning devices 71 to be movable. In the teaching mode, actuating balls 41 and 81 are in engagement with their respective recesses 40 and 72. Then chessman 23 is employed to locate movable platform 26 so that the spotlight beam 13A is on a desired second bond position pad, thus, moving device 71 to the desired second bond position. Then the clamping screw 76 is tightened on the device 71 so located at the second bond position. Actuating ball 82 is now raised and rotary table 51 is indexed to present the next positioning device 71 opposite actuating ball 82 which is lowered into the new recess 72. Each second bond positioning device 71 is located in a similar manner and locked into its unique position to complete the teaching operation of all second bond positions.

Figure 4:
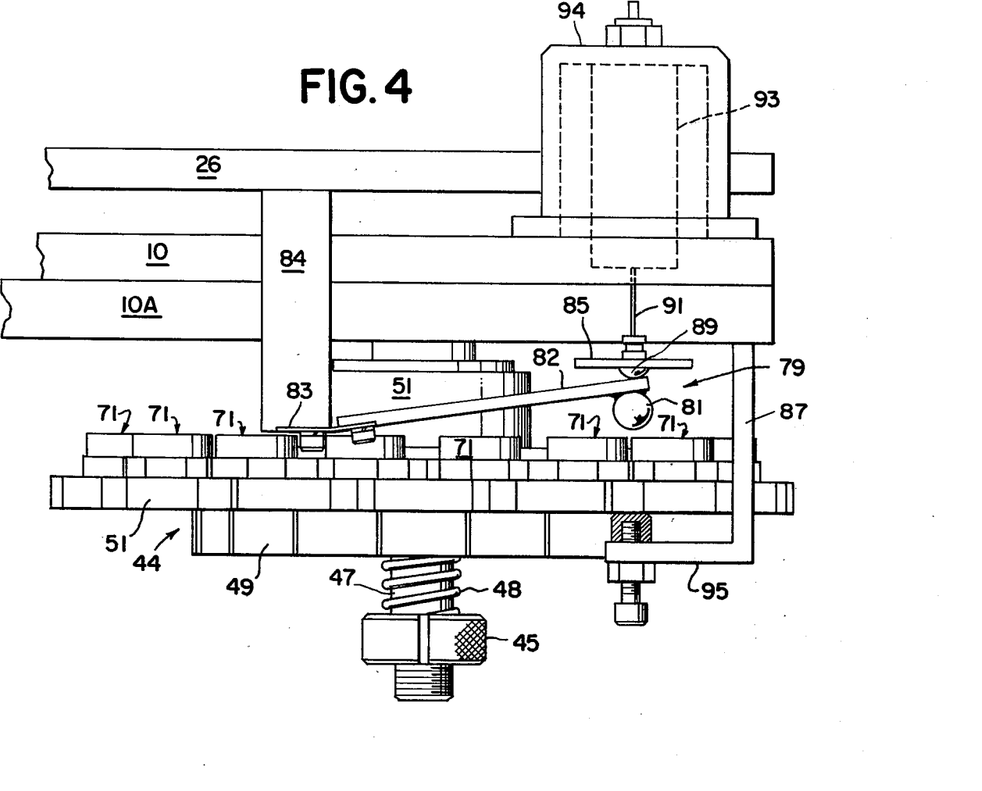
FIG. 4 is an enlarged detail in elevation taken at lines 4—4 of FIG. 2.
Figures 6, 7, 8:
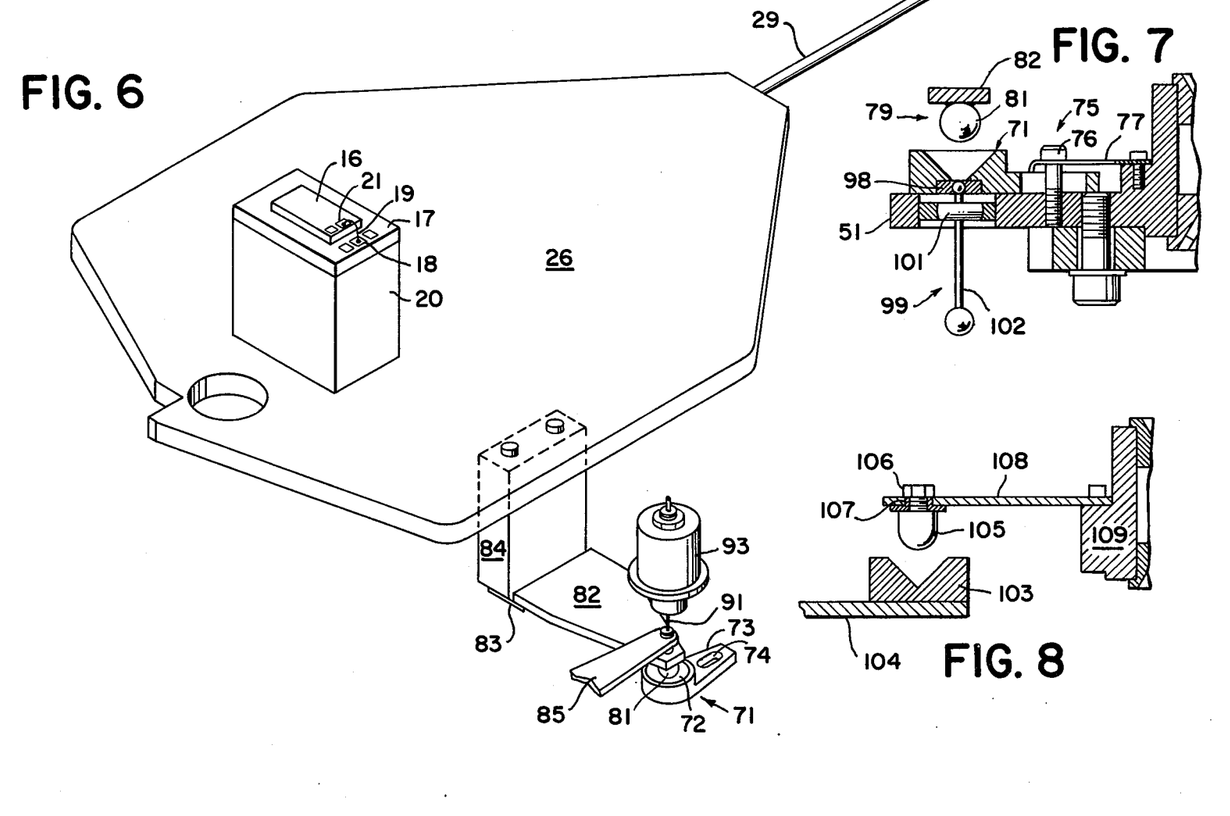
FIG. 6 is an isometric view of the movable platform of the preferred embodiment showing the second bond position actuator.
FIG. 7 is an enlarged detail in elevation of a modified form of second bond positioning means.
FIG. 8 is an enlarged detail in elevation of another modified form of second bond positioning means.

Second bond position actuating means comprise the actuator 79 mounted on movable frame 26 and adapted to engage ball 81 mounted on actuating lever 82 with recess 72. As best shown in FIGS. 4 and 6 actuating lever 82 is pivotally mounted on a leaf spring 83 supported on actuator bracket 84 which is fixed on movable platform 26. It will be understood that when ball 81 is forced into recess 72 the movable platform 26 is moved to the second bond position represented by the individual positioning device 71. Intermediate level 85 is mounted on a leaf spring 86 which is mounted to channel shaped support bracket 87 by spacer brackets 88. Intermediate lever 85 is provided with a low friction tip 89 and is biased by spring 86 to return actuating rod 91 and piston 92 upwardly into cylinder 93 mounted in housing 94 on fixed frame 10, but level 85 does not serve directly to position movable platform 26.

As best shown in FIG. 6 actuator 80 comprises an air cylinder 93 in which piston 92, connected to piston rod 91 moves. It can be seen that when the ball 81 on actuating lever 82 is moved into the conical recess 72 of the second bond positioning device 71 it causes the entire movable platform to be located in a unique second bond position determined by the position of the conical recess 72 of the second bond positioning device 71. During the positioning of movable platform 26 to a second bond position, the actuating ball 41 on lever 40 in the first bond positioning actuator is either raised to permit movement (mobilization) of the movable pivot mount 25 or there is only a yieldable pressure provided thereon.

The control means for deactivating actuator 36 while activating actuator cylinder 93 is well known and does not require a detailed description here. However, aperatured disks mounted on a cycle shaft and cooperating with a photoelectric light switch is a preferred timing means for actuating solenoid air valves employed to activate the air cylinders. Cams and limit switches have been employed in the prior art to effect actuation of air solenoid valves.

Refer now to FIGS. 1 to 4 showing channel support member 87. The lower horizontal web 95 of member 87 extends under rotary table 51 and is provided with a support screw 96 threaded through the web 95. A nylon cap 97 is provided on the exposed threaded end of screw 96 and serves as a low friction support for rotary table 51. When actuating ball 81 is forced into recess 72 there may be a tendancy for rotary table 51 to bend out of its flat horizontal plane. Any movement out of the horizontal plane would cause the exact location of the recess 72 to be arcuately changed, thus, nylon cap 97, screw 96 and support member 87 maintain the horizontal position of the rotary table 51 and maintain the accuracy of the second bond positioning devices 71.

FIG. 7 shows a modified form of rotary table 51 in which the positioning device 71 is further provided with a swivel bearing 98 in a recess below the conical recess 72 which accepts the ball end of a miniature manipulator 99 in a Heim bearing 101. The bearing 101 is located in rotary table 51 and is adapted to accept chessman rod 102 therethrough. When locating the second bond positioning device 71 at a second bond position, manual manipulation of the chessman rod 102 will assure a perfect fit or seating of the ball 81 in recess 72 with a light force on ball 81 before tightening clamping screw 76.

FIG. 8 is presented to show a reversal of parts of the modification shown in FIG. 7. A single fixed recess actuator 103 is connected by support arm 104 to the movable platform 26. When the actuating piston 92 moves downward as shown in FIGS. 1 and 4 it is adapted to depress one of a plurality of ball shaped second bond positioning devices 105 into engagement with recess actuator 103. The ball locating device 105 is provided with a locking nut 106 attached to the threaded end of the device 105 which extends through an oversize aperture 107 in flexible lever 108 to permit positioning of device 105. Flexible levers 108 may be mounted on a hub 109 shaped similar to the hub on rotary table 51.

Figure 9:
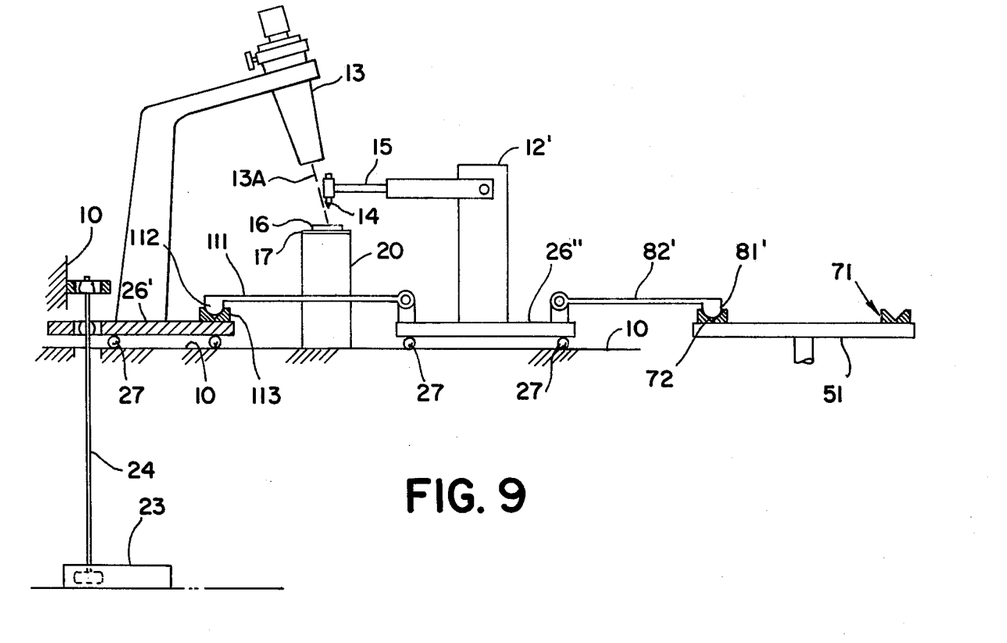
FIG. 9 is a schematic elevation similar to FIG. 1 showing a modified embodiment illustrating the reversal of moving and fixed parts.

FIG. 9 is a schematic representation of a reversal of the parts employed in the preferred embodiment FIGS. 1 through 3. The movable platform 26' is adapted to position the spotlight 13 to a first bond position. When the first bond is being made, actuator lever 111 engages ball 112 into recess 113 to couple movable platform 26' to movable platform 26" supporting the bonding tool holder 12', thus, the bonding tool 14 and spotlight beam 13A are in coincidence. When the second bond is to be made automatically (as distinguished from the teaching mode) actuator lever 111 disengages ball 112 from recess 113 and actuator lever 82' engages ball 81' into a recess 72 of a second bond positioning device 71. Locating device 71 positions movable platform 26" and bonding tool 15 to the second bond position defined by adjustable locating devices 71 on rotary table 51.

Figure 10:
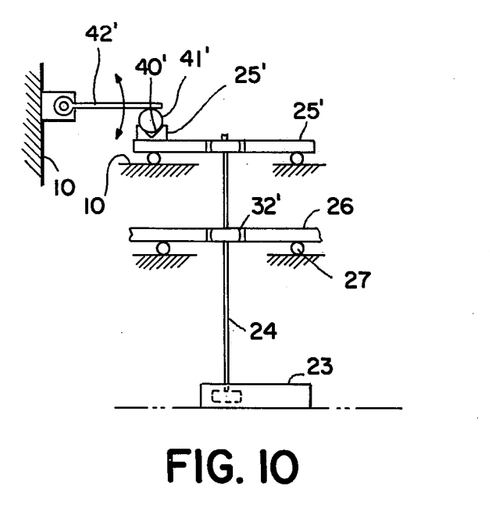
FIG. 10 is an enlarged detail in elevation of a modified first bond positioning means.

Having explained how the movable base 20 may be fixed and the fixed spotlight 13 and bonding tool holder 24 may be mobilized or made movable, it will be understood that the novel first bond positioning means also may be modified. FIG. 10 shows a modified movable pivot mount 25' mounted to provide orthagonal movement on frame 10. The recessed cup 40' is offset from center and adapted to be positioned by actuating ball 41' mounted on actuating lever 42'. The mode of operation of the micromanipulator and the mobilizing-demobilizing actuator 41', 42' is the same as that shown in FIG. 1 with regard to similar numbered elements.

Figure 11:
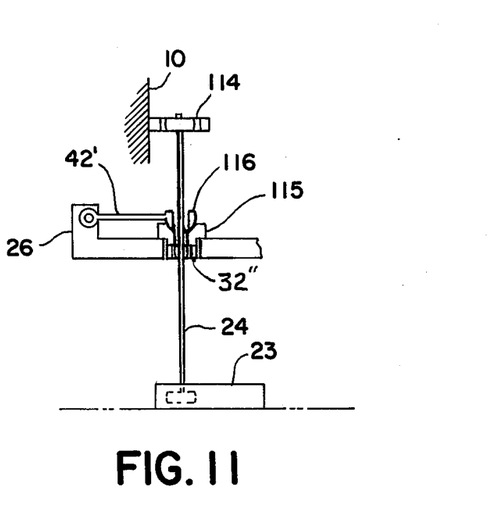
FIG. 11 is an enlarged detail in elevation of another modified first bond positioning means.

FIG. 11 illustrates a modification of the micromanipulator shown in FIGS. 1 and 10. The upper end of chessman rod 24 extends through a Heim bearing 114 in a manner similar to bearing 32, which is fixed to frame 10. Chessman rod 24 also extends through a recessed actuating device 115, similar to pivot mount 25, and is fixed on rod 24 through Heim bearing 32". A hollow ball 116, similar to ball 40, is mounted on lever 117 which is pivoted on movable frame 26. When the hollow ball 116 is forced into recess 115, movable platform 26 is controlled by chessman rod 24 as during a first bond positioning operation or a teaching mode operation. When the ball 116 is raised, chessman 23 and chessman rod 24 have no control over movable platform 26 as occurs during an automatic second bond positioning operation.

Having explained how second bond positioning devices 71 and 105 may be preset to move a movable platform 26 to a second bond position automatically after a first bond is performed, it will be understood that various types of concave and convex mating devices may be provided on different types of movable frames such as a linear platform like a typewriter carriage or on a rotary table 51 as shown in the preferred embodiment. The preferred wire bonding machine requires that the operator locate the first bond position visually and then provides means for automatically performing the second wire bond. A skilled operator can move the chessman 23 while the second bond is being automatically performed and will be able to make a final adjustment for the first bond when the movable pivot mount 25 is again demobilized for enabling the first bond.

The preferred embodiment wire bonding machine has been explained with reference to elements which may be added to existing manually operated wire bonding machines or existing type wire bonding machines. Even though the present novel wire bonding machine is manually operated, the program for a particular semiconductor device may be set on a movable frame 44 and used only when a device of the type which the program was set for is being run. When a different device is to be run, the whole rotary frame 44 may be substituted for a different frame and production can be continued with only a minor delay. While fully automatic electronic wire bonding machines are operable at a faster bonding rate than the present semiautomatic machine, the cost of the automatic machine cannot be justified on the faster production rate alone because the wire bonding machine of the present invention will produce high production and yields of acceptable semiconductor devices. In areas of plentiful cheap labor, the high initial cost and added maintenance cost of a fully automatic electronic bonder may entail higher overall cost. The operator serves as an inspector and monitors each bond during the first bond operation. Even though the pad size of the targets for wire bonding is only a few mils square the positioning devices 71 and 105 having a direct 1 to 1 ratio with the movable platform 26 have been found to be able to repeat the accuracy of the preset positions to less than 1 mil.

We claim:

1. A wire bonding machine of the type having a second bond positioning apparatus comprising:
   a rigid frame,
   a movable platform supported on said rigid frame,
   a manipulator operably connected to said rigid frame for positioning said movable platform in a horizontal plane to a plurality of different first and second bonding positions,
   means for disabling said manipulator from its operable connection to said rigid frame,
   second bond positioning means comprising a movable frame mounted on said rigid frame and having a plurality of individually adjustable positioning devices thereon,
   second bond position actuating means mounted on said movable platform and adapted to cooperate with said individual adjustable positioning devices on said movable frame, and
   control means for activating said second bond position actuating means and said means for disabling said manipulator from its operable connection to said rigid frame, whereby said movable table is positioned to one of said plurality of second bond positions defined by said second bond positioning means.

2. A wire bonding machine of the type set forth in claim 1 wherein said movable frame comprises a rotary table, and
   drive means for stepping said rotary table to present different ones of said individual adjustable positioning devices opposite said second bond position actuating means.

3. A wire bonding machine of the type set forth in claim 2 which further includes clamping means for locking said individual adjustable positioning devices to said rotary table at a predetermined position representative of an individual second bond position.

4. A wire bonding machine of the type set forth in claim 3 wherein said clamping means comprise a locking screw and a clamping plate mounted on said rotary table and cooperable with individual ones of said individual adjustable positioning devices, whereby each said adjustable positioning device is settable to a different second bond position.

5. A wire bonding machine of the type set forth in claim 2 wherein said movable frame of said second bond position means is removably mounted for rotary movement on a vertical shaft extending from said fixed frame, and
   retainer means for urging said removably mounted movable frame into operable engagement with said vertical shaft, whereby removable frames having a different number of individually adjustable positioning devices thereon are readily substitutable in said wirebonding machine.

6. A wire bonding machine of the type set forth in claim 2 wherein said drive means further includes a roller follower mounted on said rigid frame cooperating with a vee groove on said rotary table indicative of each of said second bond positions, whereby the angular position of each second bond positioning device is located independant of each other.

7. A wire bonding machine of the type set forth in claim 1 wherein said individual adjustable positioning devices each comprise recessed cam surfaces and said second bond position actuating means comprise a convex follower cooperable with said recessed cam surfaces.

8. A wire bonding machine of the type set forth in claim 7 wherein said recessed cam surfaces comprises a concave cup shaped recess and said convex follower comprises a mating surface of revolution having line contact with said cup shaped recess.

9. A wire bonding machine of the type set forth in claim 1 which further includes a piston mounted on said rigid frame and having an actuation rod cooperable with said second bond position actuating means mounted on said movable platform.

10. A wire bonding machine of the type set forth in claim 1 wherein said movable frame comprises a linearly movable table, and
    said drive means being adapted to step said linearly movable table to present different ones of said individual adjustable positioning devices opposite said second bond position actuating means.

11. A wire bonding machine of the type set forth in claim 1 wherein said drive means comprises a ratchet on said movable frame, and
    an actuating pawl pivotally mounted on said fixed frame and cooperable with said ratchet to step said movable frame one positioning device at a time.

12. A wire bonding machine of the type having a second bond positioning apparatus comprising:
    a rigid frame,
    a movable bonding tool supported on said rigid frame,
    a movable platform supported on said rigid frame for supporting a semiconductor to be wire bonded by said bonding tool,
    second bond positioning means comprising a movable frame mounted on said rigid frame and a plurality of individually adjustable positioning devices mounted thereon,
    second bond position actuating means mounted on said movable platform and adapted to engage different individual adjustable positioning devices to define a second bond position, and
    control means for activating said second bond position actuating means for setting said individually adjustable positioning devices in a learning mode and whereby said movable platform is moved automatically to a second bond position in an operational mode.

13. A wire bonding machine of the type set forth in claim 12 wherein a manipulator connected to said movable platform is employed to locate a first bond position on said semiconductor and said control means further includes means for bonding a wire at said first bond position and bonding the same wire to said second bond position after said semiconductor is located by said second bond positioning means cooperating with said second bond position actuating means.

14. A wire bonding machine of the type set forth in claim 12 wherein the support for said movable platform on said rigid frame further includes kinematic restraining means mounted on said rigid frame for obtaining substantially orthagonal motion of said movable platform, said kinematic restraining means comprising a sliding and turning pair.

15. A wire bonding machine of the type set forth in claim 12 wherein said movable frame comprises a rotary table and said plurality of individually adjustable positioning devices mounted thereon each comprise a concave recess, and which further includes
a detent in said rotary table cooperating with a roller for precisely locating said rotary table at a predetermined angular position to present an individual positioning device opposite said second bond position actuating means, whereby said detent and said roller on said rotary table form a unique pair of locating surfaces defining a repeatable second bond position not limited by machining accuracy.

16. A wire bonding apparatus as set forth in claim 15 wherein said second bond positioning means is removably mounted on a vertical stub shaft on said fixed frame, and which further includes,
retainer means for rapidly releasing a second bond positioning means from said shaft to enable substitution of another second bond position means thereon representative of a different program of second position bonds.

17. A wire bonding machine of the type having a second bond positioning apparatus comprising:
a rigid frame,
a movable platform supported on said rigid frame,
a manipulator operably connected to said rigid frame for positioning said movable platform in a horizontal plane to a plurality of different first and second bonding positions,
means for disabling said manipulator from its operable connection to said rigid frame,
second bond positioning means comprising a movable frame mounted on said rigid frame and providing a plurality of different second bond positioning means thereon,
second bond position actuating means mounted on said movable platform and adapted to cooperate with said (second bond) positioning means on said movable frame, and
control means for activating said second bond position actuating means and said means for disabling said manipulator from its operable connection to said rigid frame, whereby said movable table is positioned to one of said plurality of second bond positions defined by said second bond positioning means.

18. A wire bonding machine of the type having a first bond positioning means and a second bond positioning apparatus comprising;
a rigid frame,
a movable bonding tool supported on said rigid frame,
a movable platform supported on said rigid frame for supporting a semiconductor to be wire bonded by said wire bonding tool,
first bond positioning means comprising a manipulator for moving said movable platform to a first bond position,
said manipulator comprising a chessman rod having a chessman at one end and a movable pivot at the other end,
means for demobilizing said movable pivot when making a first bond,
said means for demobilizing said movable pivot comprising a convex actuator mounted on a pivotable arm for engagement with a recess on said movable pivot, for fixing said pivot relative to said chessman rod,
second bond positioning means mounted on said fixed frame and adapted to position said movable platform when said means for demobilizing said movable pivot permits said movable pivot to be moved by said movable platform, and
control means for disengaging said means for demobilizing said movable pivot and activating said second bond positioning means.

19. A wire bonding apparatus as set forth in claim 18 wherein said means for demobilizing said movable pivot comprises a convex actuator pivotally mounted on said fixed frame for engagement with a recess at the extreme end of said chessman rod, whereby the pivoted end of said chessman rod may be pivotally connected to said fixed frame.

20. A wire bonding apparatus as set forth in claim 18 wherein said means for demobilizing said movable pivot comprises a convex shaped actuator pivotally mounted on said movable platform and engagable with a mating recess intermediate the extreme ends of said chessman rod, whereby the chessman rod may be connected to movable platform.

* * * * *